United States Patent
Byun et al.

(10) Patent No.: US 9,324,394 B2
(45) Date of Patent: Apr. 26, 2016

(54) STROBE SIGNAL GENERATION DEVICE AND MEMORY APPARATUS USING THE SAME

(71) Applicant: SK hynix Inc., Icheon-si Gyeonggi-do (KR)

(72) Inventors: Hee Jin Byun, Icheon-si (KR); Ki Chang Kwean, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 125 days.

(21) Appl. No.: 14/188,793

(22) Filed: Feb. 25, 2014

(65) Prior Publication Data

US 2015/0063044 A1 Mar. 5, 2015

(30) Foreign Application Priority Data

Aug. 30, 2013 (KR) .................. 10-2013-0104027

(51) Int. Cl.
| | | |
|---|---|---|
| *G11C 7/00* | (2006.01) | |
| *G11C 7/22* | (2006.01) | |
| *G11C 11/4076* | (2006.01) | |
| *G11C 7/10* | (2006.01) | |

(52) U.S. Cl.
CPC ............... *G11C 7/22* (2013.01); *G11C 7/1093* (2013.01); *G11C 11/4076* (2013.01)

(58) Field of Classification Search
None
See application file for complete search history.

(56) References Cited

U.S. PATENT DOCUMENTS

2007/0002644 A1* 1/2007 Kang .................. G11C 7/1006
365/193

FOREIGN PATENT DOCUMENTS

| KR | 100668854 B1 | 1/2007 |
|---|---|---|
| KR | 100670654 B1 | 1/2007 |

* cited by examiner

*Primary Examiner* — Kretelia Graham (74) *Attorney, Agent, or Firm* — William Park & Associates Ltd.

(57) ABSTRACT

A strobe signal generation device includes an enable signal generating section, a buffering section and a strobe signal driving section. The enable signal generation section generates a division enable signal in response a strobe signal. The buffering section configured to generate a delayed strobe signal from the strobe signal while the division enable signal is enabled. The strobe signal driving section configured to generate a plurality of data strobe signals with a larger pulse width than the delayed strobe signal, in response to the division enable signal and the delayed strobe signal.

18 Claims, 9 Drawing Sheets

STROBE SIGNAL GENERATION DEVICE AND MEMORY APPARATUS USING THE SAME

CROSS-REFERENCES TO RELATED APPLICATION

The present application claims priority under 35 U.S.C. §119(a) to Korean application number 10-2013-0104027, filed on Aug. 30, 2013, in the Korean Intellectual Property Office, which is incorporated herein by reference in its entirety.

BACKGROUND

1. Technical Field

Various embodiments relate to a memory apparatus, and more particularly, to a strobe signal generation device and a memory apparatus using the same.

2. Related Art

In general, a memory apparatus may communicate with a host device by receiving data or outputting data in synchronization with a clock. In particular, the memory apparatus may receive a strobe signal together with the data when receiving the data from the host device. The host device may inform a time when the data is to be transmitted to the memory apparatus, by providing the strobe signal to the memory apparatus together with the data. The strobe signal may be generated on the basis of the clock.

As the performance of a memory apparatus is improved, the memory apparatus may operate with a reduced amount of power and may communicate with a host device at a higher speed. As the host device and the memory apparatus communicate with each other at a higher speed, a clock with a higher frequency is used. The memory apparatus receives a strobe signal from the host device and internally stores data using the strobe signal. As described above, the strobe signal may be generated on the basis of the clock. For example, the strobe signal may have a pulse which is enabled for one cycle of the clock. When the frequency of the clock is high, a time margin for the memory apparatus to store data may be insufficient as the pulse of to the strobe signal becomes too short. In this consideration, a memory apparatus operating at a high speed has used a strobe signal by dividing it.

SUMMARY

In an embodiment of the present invention, a strobe signal generation device includes: an enable signal generating section configured to generate a division enable signal in response to a strobe signal; a buffering section configured to generate a delayed strobe signal from the strobe signal while the division enable signal is enabled; and a strobe signal driving section configured to generate a plurality of data strobe signals with a larger pulse width than the delayed strobe signal, in response to the division enable signal and the delayed strobe signal.

In an embodiment of the present invention, a strobe signal generation device includes: an enable signal generating section configured to generate a division enable signal in response to a strobe signal; a buffering section configured to generate a delayed strobe signal from the strobe signal while the division enable signal is enabled; a strobe signal driving section configured to generate a plurality of data strobe signals with a larger pulse width than the delayed strobe signal, in response to the division enable signal and the delayed strobe signal; and a reset signal generating section configured to generate a reset signal in response to the division enable signal.

In an embodiment of the present invention, a memory apparatus includes: a latency unit configured to delay a write signal and generate an internal write signal; a strobe signal generation unit configured to generate a plurality of data strobe signals with a larger pulse width than a strobe signal, in response to the strobe signal and is the internal write signal, and prevent the data strobe signals from being generated at a specified time; and a data input unit configured to latch data in response to the plurality of data strobe signals.

In an embodiment of the present invention, a system comprises: a processor; a controller configured to receive a request and a data from the processor; and a memory unit configured to receive the request and the data from the controller, wherein the memory unit comprises: an enable signal generating section configured to generate a division enable signal in response to a strobe signal; a buffering section configured to generate a delayed strobe signal while the division signal is enabled; and a strobe signal driving section configured to generate a plurality of data strobe signals with a larger pulse width than the delayed strobe signal, in response to the division enable signal and the delayed strobe signal.

BRIEF DESCRIPTION OF THE DRAWINGS

Features, aspects, and embodiments are described in conjunction with the attached drawings, in which.

DETAILED DESCRIPTION

Hereinafter, a strobe signal generation device and a memory apparatus using the same according to the present invention will be described below with reference to the accompanying drawings is through various embodiments.

Figure 1:
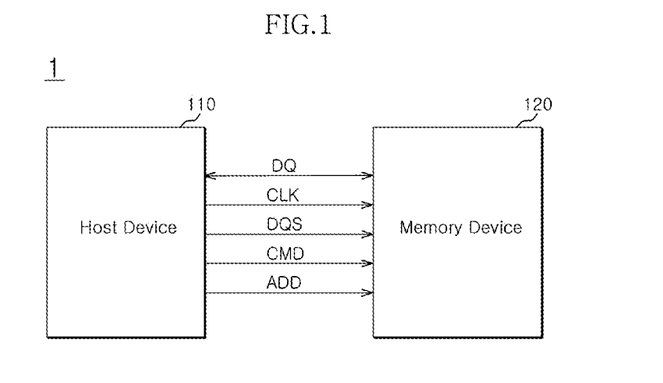
FIG. 1 is a block diagram schematically showing the configuration of a system in accordance with an embodiment of the present invention.

Referring to FIG. 1, a system 1 includes a host device 110 and a memory apparatus 120. The host device 110 and the memory apparatus 120 may communicate using a plurality of buses. The plurality of buses may include a data bus, a clock bus, a data strobe bus, a command bus, an address bus, and so forth. The host device 110 may store data DQ in the memory apparatus 120 by providing the data DQ, a clock signal CLK, a data strobe signal DQS, a command signal CMD and an address signal ADD through the buses. Also, the host device 110 may receive the data DQ outputted from the memory apparatus 120 by providing data DQ, a clock signal CLK, a command signal CMD and an address signal ADD. The memory apparatus 120 may store data DQ by receiving the signals from the host device 110 through the buses, or may output stored data DQ to the host device 110.

The host device 110 may be a memory controller or a host processor. The host device 110 may include a central processing unit (CPU), a graphic processing unit (GPU), a digital signal processor (DSP), at least one processor core, a single core processor, a dual core processor, a multiple core processor, a microprocessor, a host processor, a controller, a plurality of processors or controllers, a chip, a micro chip, a logic circuit, an integrated circuit (IC) or an application-specific IC.

The memory apparatus 120 may include a volatile random access memory apparatus such as a DRAM or may include a nonvolatile random access memory such as a PCRAM, an ReRAM, an FeRAM, an MRAM and an STTRAM.

Figure 2:
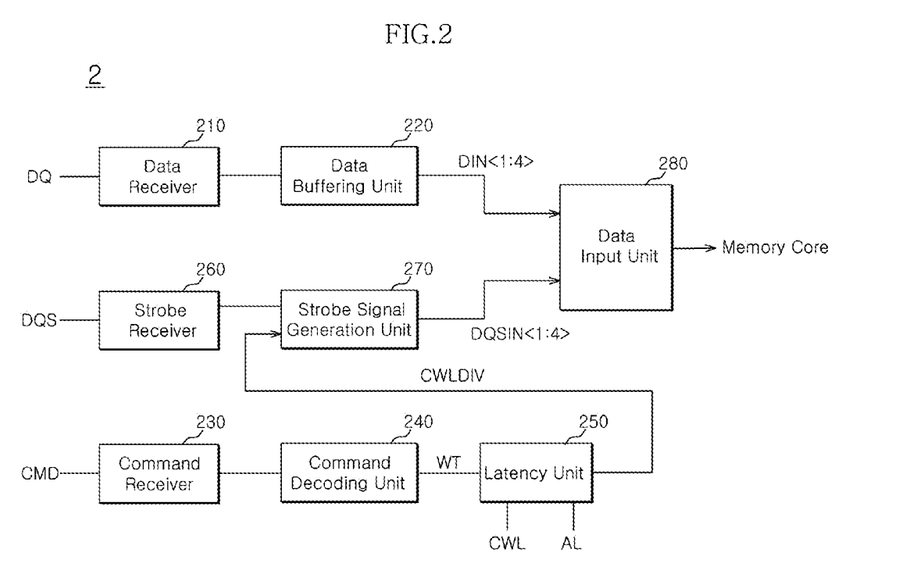
FIG. 2 is a block diagram showing the configuration of a memory apparatus in accordance with an embodiment of the present invention.

FIG. 2 is a block diagram showing the configuration of a memory apparatus 2 in accordance with an embodiment of the present invention. The memory apparatus 2 may be applied to the memory apparatus 120 shown in FIG. 1. Referring to FIG. 2, the memory apparatus 2 may include a data receiver 210, a data buffering unit 220, a command receiver 230, a command decoding unit 240, a latency unit 250, a strobe receiver 260, a strobe signal generation unit 270, and a data input unit 280.

The data receiver 210 is electrically coupled with the data bus, and receives the data DQ which is transmitted from the host device 110, through the data bus. The data buffering unit 220 is configured to buffer output signals of the data receiver 210 and output the buffering result as an input data DIN<1:4> to the Data input unit 280.

The command receiver 230 is electrically coupled with the command bus, and receives the command signal CMD which is transmitted from the host device 110, through the command bus. The command decoding unit 240 is configured to decode the command signal CMD which is transmitted from the host device 110, and generate a signal for storing the data DQ transmitted from the host device 110. The signal may be a write signal WT which instructs a data storing operation. The latency unit 250 is configured to receive the write signal WT, delay the write signal WT by a write latency and is generate an internal write signal CWLDIV. The write latency defines a time from when the data DQ is inputted from the host device 110 to when the data DQ is actually stored in the memory apparatus 2. In general, the write latency is information which may be provided from a mode register. The write latency may include, for example, a CAS write latency (CWL) and an additive latency (AL).

The internal write signal CWLDIV provides write information to the strobe signal generation unit 270 such that the memory apparatus 2 may perform a write operation. The internal write signal CWLDIV may be generated on the basis of the write latency, and may be generated from the write signal WT before a time corresponding to the write latency such that the write operation may be smoothly performed.

The strobe receiver 260 is electrically coupled with the strobe bus, and receives the strobe signal DQS which is transmitted from the host device 110, through the strobe bus. The strobe signal generation unit 270 receives the strobe signal DQS which is received through the strobe receiver 260. The strobe signal generation unit 270 may generate a plurality of data strobe signals DQSIN<1:4> in response to the internal write signal CWLDIV and the strobe signal DQS. The strobe signal generation unit 270 may generate the data strobe signals DQSIN<1:4> which have a larger pulse width than the strobe signal DQS. That is to say, the strobe signal generation unit 270 may generate the data strobe signals DQSIN<1:4> by dividing the strobe signal DQS. Also, the strobe signal generation unit 270 may prevent the data strobe signals DQSIN<1:4> from being generated at a specified time. For example, the strobe signal generation unit 270 may prevent the data strobe signals DQSIN<1:4> from being generated at the specified time, according to the burst length of the memory apparatus 2 and whether or not CRC data is received. (The burst length is not shown in the FIG. 2) The burst length defines that the memory apparatus 2 receives one command signal and consecutively performs a multitude of times an operation corresponding to the command signal.

The data input unit 280 receives the input data DIN<1:4> from the data buffering unit 220 and receives the data strobe signals DQSIN<1:4> from the strobe signal generation unit 270. The data input unit 280 may latch the input data DIN<1:4> in synchronization with the data strobe signals DQSIN<1:4> and may store the latched data in a memory core.

Figure 3:
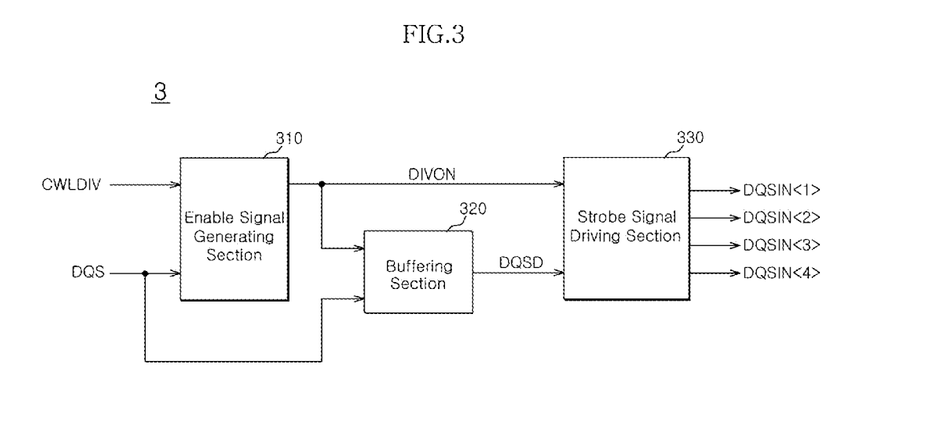
FIG. 3 is a block diagram showing the configuration of a is strobe signal generation device in accordance with an embodiment of the present invention.

FIG. 3 is a block diagram showing the configuration of a strobe signal generation device 3 in accordance with an embodiment of the present invention. The strobe signal generation device 3 may be used as the strobe signal generation unit 270 of the memory apparatus 2 shown in FIG. 2. In FIG. 3, the strobe signal generation to device 3 includes an enable signal generating section 310, a buffering section 320, and a strobe signal driving section 330. For example, the strobe signal generation device 3 may correspond to the strobe signal generation unit 270 of the FIG. 2. The enable signal generating section 310 may generate a division enable signal DIVON in response to the internal write signal CWLDIV and the strobe signal DQS. The enable signal generating section 310 may enable the division enable signal DIVON in response to a preamble of the strobe signal DQS when the internal write signal CWLDIV is enabled. The strobe signal DQS has the preamble. The preamble may be generated by the strobe receiver 260 such that the strobe signal DQS received from the host device 110 may be precisely generated internally. The preamble may lock the strobe signal DQS to a specified level before the pulses of the strobe signal DQS are generated. For example, the preamble may retain a high level for a time corresponding to 2 cycles of the clock signal CLK and may transition to a low level before the pulses of the strobe signal DQS are generated. The enable signal generating section 310 may enable the division enable signal DIVON in response to the transition of the preamble to the low level when the internal write signal CWLDIV is enabled. Further, the enable signal generating section 310 may disable the division enable signal DIVON in response to the strobe signal DQS. For example, the enable signal generating section 310 may disable the division enable signal DIVON in response to the falling of a last pulse when the strobe signal DQS has 4 pulses.

The buffering section 320 receives the division enable signal DIVON and the strobe signal DQS, buffers the strobe signal DQS, and generates a delayed strobe signal DQSD. The buffering section 320 may provide the strobe signal DQS which is inputted while the division enable signal DIVON is enabled as the delayed strobe signal DQSD, to the strobe signal driving section 330.

The strobe signal driving section 330 may receive the division enable signal DIVON and the delayed strobe signal DQSD, and may generate the plurality of data strobe signals DQSIN<1:4> in response to the division enable signal DIVON and the delayed strobe signal DQSD. The strobe signal driving section 330 may generate the plurality of data strobe signals DQSIN<1:4> which have a larger pulse width than the delayed strobe signal DQSD. The strobe signal driving section 330 may divide the delayed strobe signal DQSD and generate the plurality of data strobe signals DQSIN<1:4> which have the larger pulse width than the delayed strobe signal DQSD.

Figure 4:
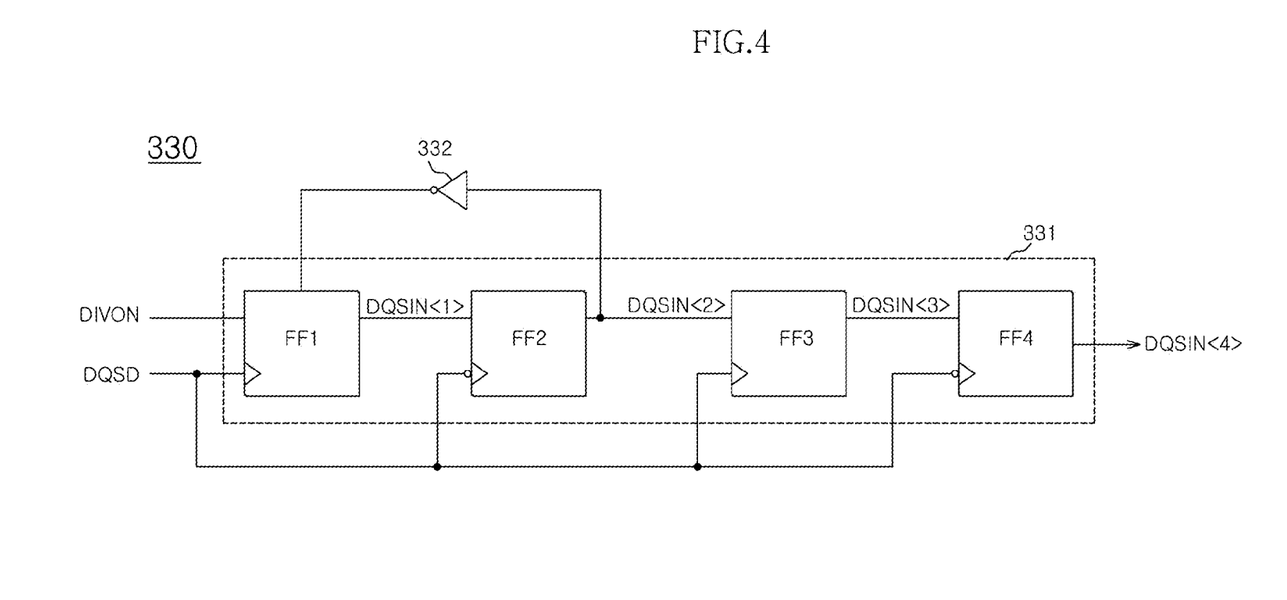
FIG. 4 is a diagram showing the configuration of an embodiment of the strobe signal driving section shown in FIG. 3.

FIG. 4 is a diagram showing the configuration of an embodiment of the strobe signal driving section 330 shown in FIG. 3. Referring to FIG. 4, the strobe signal driving section 330 includes a flip-flop chain 331, and an inverter 332. The flip-flop chain 331 may divide the delayed strobe signal DQSD and generate the plurality of data strobe signals DQSIN<1:4>. The flip-flop chain 331 may generate the plurality of data strobe signals DQSIN<1:4> in response to the delayed strobe signal DQSD and the division enable signal DIVON. In FIG. 4, the flip-flop chain 331 may include first to fourth flip-flops FF1 to FF4 which are electrically coupled in series, and may generate first to fourth data strobe signals DQSIN<1:4>. The number of flip-flops which constitute the flip-flop chain 331 and the number of data strobe signals which are generated from the flip-flop chain 331 may be changed according to the burst length of the memory apparatus 2. The first to fourth flip-flops FF1 to FF4 receive the delayed strobe signal DQSD through the respective clock terminals thereof. The first and third flip-flops FF1 and FF3 may receive the delayed strobe signal DQSD, and the second and fourth flip-flops FF2 and FF4 may receive the inverted signal of the delayed strobe signal DQSD. The first flip-flop FF1 receives the division enable signal DIVON and outputs the first data strobe signal DQSIN<1> in response to the delayed strobe signal DQSD. The second flip-flop FF2 receives the first data strobe signal DQSIN<1> from the first flip-flop FF1 and outputs the second data strobe signal DQSIN<2> in response to the inverted signal of the delayed strobe signal DQSD. The third flip-flop FF3 receives the second data strobe signal DQSIN<2> from the second flip-flop FF2 and outputs the third data strobe signal DQSIN<3> in response to the delayed strobe signal DQSD. The fourth flip-flop FF4 receives the third data strobe signal DQSIN<3> from the third flip-flop FF3 and outputs the fourth data strobe signal DQSIN<4> in response to the inverted signal of the delayed strobe signal DQSD.

The inverter 332 resets the first flip-flop FF1 of the flip-flop chain 331 in response to the output of one flip-flop of the flip-flop chain 331. In FIG. 4, the inverter 332 may receive the second data strobe signal DQSIN<2> as the output of the second flip-flop FF2 and reset the first flip-flop FF1. In the case where the inverter 332 receives the output of the second flip-flop FF2 and resets the first flip-flop FF1, the data strobe signals DQSIN<1:4> which have a pulse width two times larger than the delayed strobe signal DQSD may be generated. In order to control the pulse width of the data strobe signals DQSIN<1:4>, the inverter 332 may receive the output of another flip-flop.

Figure 5:
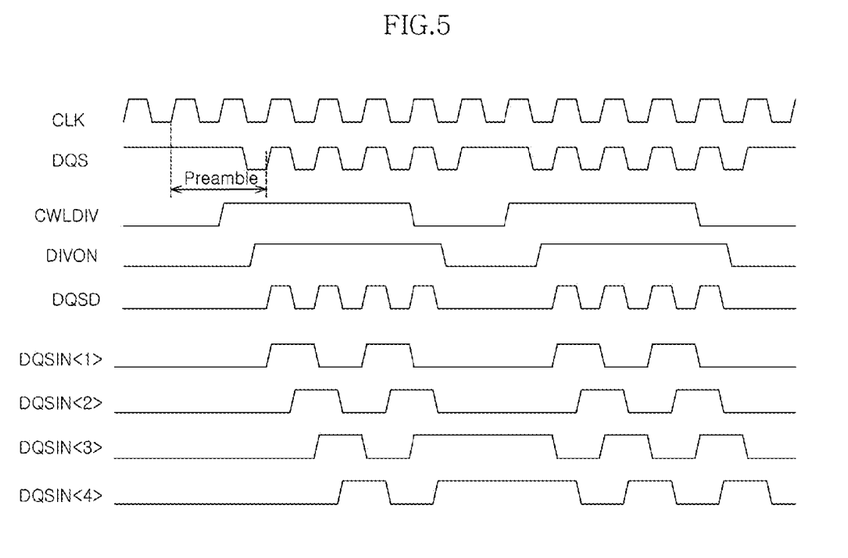
FIG. 5 is a timing diagram showing operations of the strobe signal generation device in accordance with an embodiment of the present invention.

FIG. 5 is a timing diagram showing operations of the strobe signal generation device 3 in accordance with an embodiment of the present invention. Operations of the memory apparatus 2 in accordance with an embodiment of the present invention will be described with reference to FIGS. 1 to 5. In FIG. 5, it will be exemplified that the memory apparatus 2 operates with the burst length of 4 and receives the strobe signal DQS with 4 pulses from the host device 110. The enable signal generating section 310 enables the division enable signal DIVON during the preamble period of the strobe signal DQS when the internal write signal CWLDIV is enabled. The buffering section 320 buffers the strobe signal DQS when the division enable signal DIVON is enabled, and generates the delayed strobe signal DQSD.

The first flip-flop FF1 of the strobe signal driving section 330 enables the first data strobe signal DQSIN<1> to a high level in synchronization with the rising edge of the first pulse of the delayed strobe signal DQSD. The second flip-flop FF2 receives the first data strobe signal DQSIN<1> in synchronization with the falling edge of the first pulse of the delayed strobe signal DQSD, and enables the second data strobe signal DQSIN<2> to a high level. The inverter 332 receives the second data strobe signal DQSIN<2> of the high level, and resets the first flip-flop FF1. The inverter 332 may have a delay time corresponding to one half cycle of the clock signal CLK. In synchronization with the rising edge of the second pulse of the delayed strobe signal DQSD, the third flip-flop FF3 receives the second data strobe signal DQSIN<2> of the high level and enables the third data strobe signal DQSIN<3> to a high level, and the first flip-flop FF1 disables the first data strobe signal DQSIN<1> to a low level. In synchronization with the falling edge of the second pulse of the delayed strobe signal DQSD, the second flip-flop FF2 receives the first data strobe signal DQSIN<1> of the low level and disables the second data strobe signal DQSIN<2>, and the fourth flip-flop FF4 receives the third data strobe signal DQSIN<3> of the high level and enables the fourth data strobe signal DQSIN<4> to a high level. As the above-described operations are repeated, the plurality of data strobe signals DQSIN<1:4> with the larger pulse width than the delayed strobe signal DQSD may be generated. If the division enable signal DIVON is disabled, the generation of the data strobe signals DQSIN<1:4> may be interrupted, and, if the next division enable signal DIVON is enabled, the data strobe signals DQSIN<1:4> may be generated again.

Figure 6:
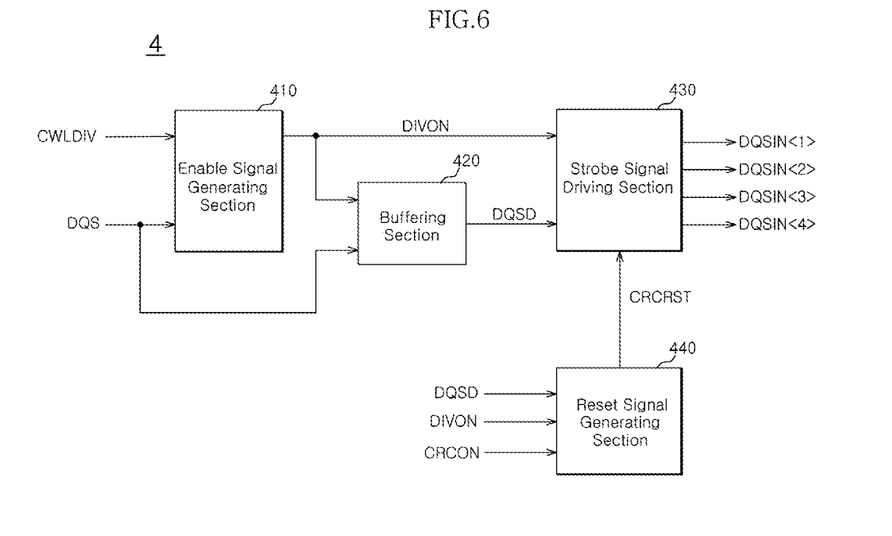
FIG. 6 is a block diagram showing the configuration of a strobe signal generation device in accordance with an embodiment of the present invention.

FIG. 6 is a block diagram showing the configuration of a strobe signal generation device 4 in accordance with an embodiment of the present invention. For example, the strobe signal generation device 4 may correspond to the strobe signal generation unit 270 of the FIG. 2. Referring to FIG. 6, the strobe signal generation device 4 may include an enable signal generating section 410, a buffering section 420, a strobe signal driving section 430, and a reset signal generating section 440. The enable signal generating section 410 and the buffering section 420 have the same configurations as the enable signal generating section 310 and the buffering section 320 of the strobe signal generation device 3 shown in FIG. 3. FIG. 6 also illustrates an internal write signal CWLDIV.

The strobe signal driving section 430 may generate a plurality of data strobe signals DQSIN<1:4> in response to the division enable signal DIVON, the delayed strobe signal DQSD and a reset signal CRCRST. The strobe signal driving section 430 may generate the plurality of data strobe signals DQSIN<1:4> with a wider pulse width than the delayed strobe signal DQSD in response to the division enable signal DIVON and the delayed strobe signal DQSD, and may prevent the data strobe signals DQSIN<1:4> from being generated at a specified timing, in response to the reset signal CRCRST. The specified timing may be determined according to the burst length of the memory apparatus 2 and whether or not the memory apparatus 2 receives CRC data. The CRC data as a signal which may be transmitted from the host device 110 is a signal which may be inputted to check whether or not an error exists in the data transmitted from the host device 110 to the memory apparatus 120. In general, in order to improve the areal efficiency of a memory apparatus, the number of the pads provided to the memory apparatus is limited. Therefore, it is inefficient to provide separate is pads to the memory apparatus to receive CRC data. Thus, a memory apparatus may receive not only a strobe signal but also CRC data through a strobe pad. The CRC data may be transmitted to the memory apparatus 2 through the strobe bus through which the strobe signal DQS is transmitted, after the strobe signal DQS is transmitted according to the burst length of the memory apparatus 2. For example, in the case where the memory apparatus 2 operates with the burst length of 4, the strobe signal DQS with 4 pulses may be inputted. The CRC data may be transmitted to the memory apparatus 2 through the strobe bus immediately after the strobe signal DQS with the 4 pulses is transmitted.

The reset signal generating section 440 generates the reset signal CRCRST on the basis of the division enable signal DIVON. Further, the reset signal generating section 440 may cyclically generate the reset signal CRCRST according to the burst length of the memory apparatus 2. The reset signal generating section 440 may generate the reset signal CRCRST additionally in response to the delayed strobe signal DQSD and a CRC signal CRCON.

Figure 7:
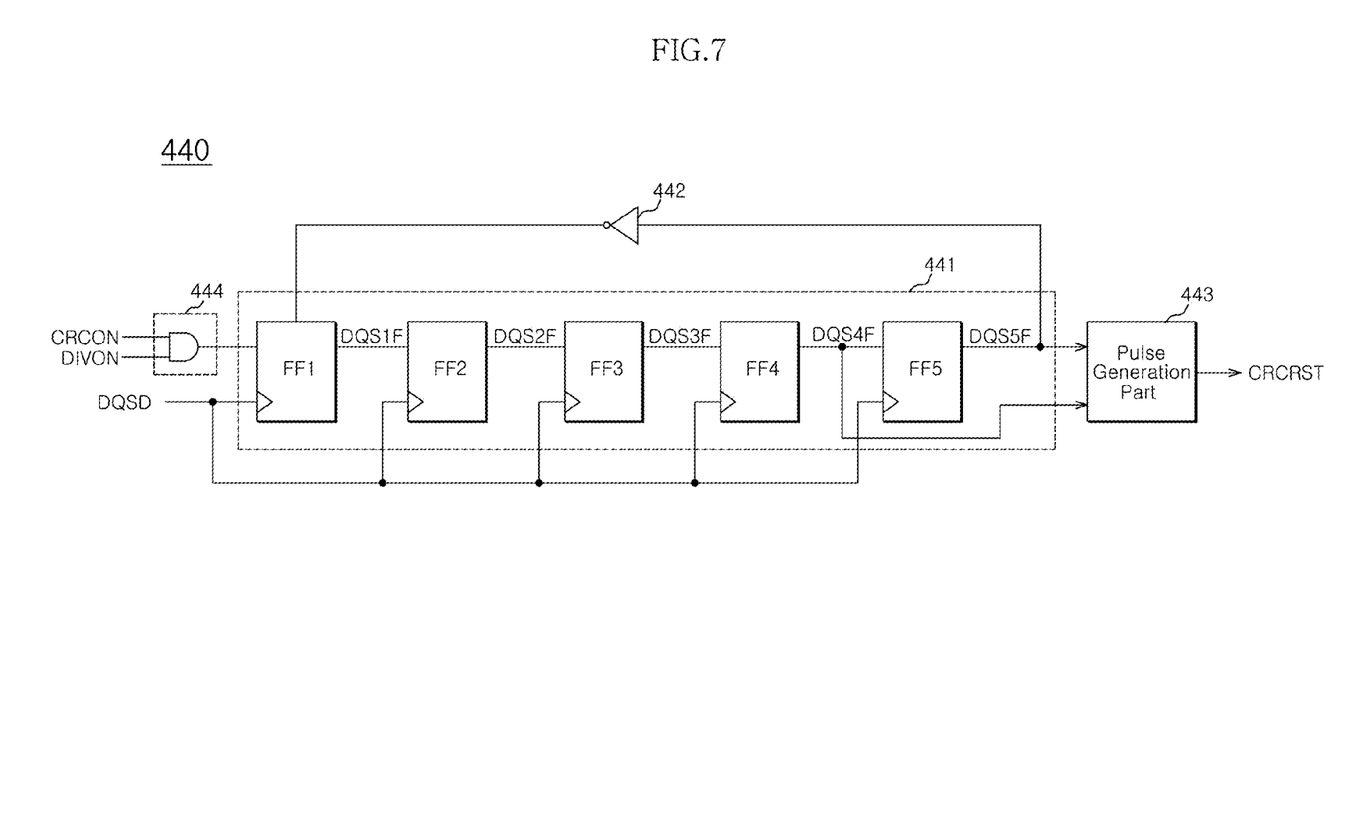
FIG. 7 is a diagram showing the configuration of an embodiment of the reset signal generating section shown in FIG. 6.

FIG. 7 is a diagram showing the configuration of an embodiment of the reset signal generating section 440 shown in FIG. 6. Referring to FIG. 7, the reset signal generating section 440 may include a flip-flop chain 441, an inverter 442, and a pulse generation part 443. The flip-flop chain 441 may include a plurality of flip-flops which are electrically coupled in series. The flip-flop chain 441 generates respective outputs DQS1F to DQS5F in response to the division enable signal DIVON and the delayed strobe signal DQSD. In FIG. 7, the flip-flop chain 441 may include first to fifth flip-flops FF1 to FF5. The number of flip-flops may be changed according to the burst length of the memory apparatus 2. In the case where the burst length of the memory apparatus 2 is 4, after the division enable signal DIVON is enabled, the output DQS4F of the fourth flip-flop FF4 may be generated at a time when the CRC data is inputted after all the pulses of the strobe signal DQS are generated according to the burst length. Also, the output DQS5F of the fifth flip-flop FF5 may be generated at a time when the input of the CRC data is ended.

The inverter 442 may reset the first flip-flop FF1 by inverting the output DQS5F of the fifth flip-flop FF5. Therefore, the outputs DQS1F to DQS5F of the flip-flop chain 441 may be cyclic signals which have a time corresponding to 5 cycles of the clock signal CLK, as one half cycle. The pulse generation part 443 may receive the output DQS4F of the fourth flip-flop FF4 and the output DQS5F of the fifth flip-flop FF5 and generate the reset signal CRCRST. The pulse generation part 443 may receive the outputs DQS4F and DQS5F of the fourth and fifth flip-flops FF4 and FF5 and generate the reset signal CRCRST which is enabled for a time corresponding to one cycle of the clock signal CLK. Since the outputs DQS4F and DQS5F of the fourth and fifth flip-flops FF4 and FF5 are cyclic signals, the reset signal CRCRST may be generated one time every 10 cycles of the clock signal CLK.

The reset signal generating section 440 may further include an input part 444. The input part 444 may provide the division enable signal DIVON to the flip-flop chain 441 in response to the CRC signal CRCON. The CRC signal CRCON is a signal which may be enabled when the memory apparatus 2 performs an operation of receiving CRC data. The CRC signal CRCON may be provided from the host device 110 and may be provided from a mode register in the memory apparatus 2.

Figure 8:
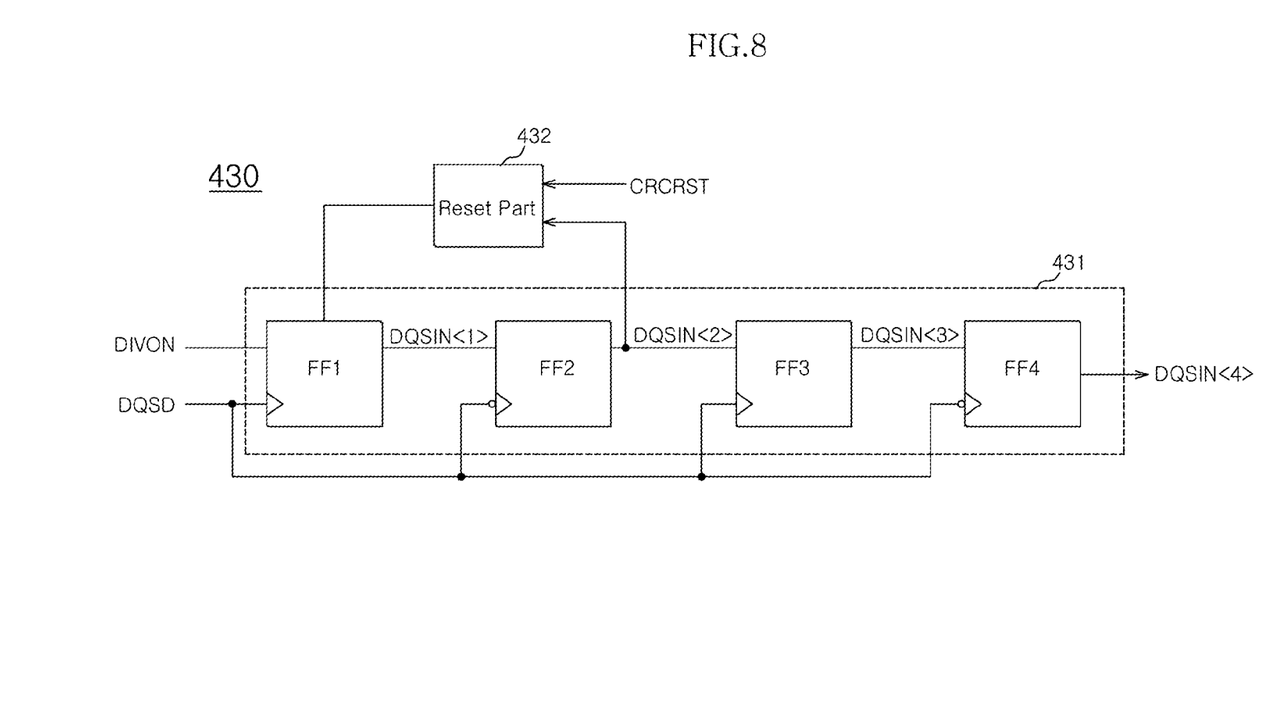
FIG. 8 is a diagram showing the configuration of an embodiment of the strobe signal driving section shown in FIG. 6.

FIG. 8 is a diagram showing the configuration of an embodiment of the strobe signal driving section 430 shown in FIG. 6. Referring to FIG. 8, the strobe signal driving section 430 includes a flip-flop chain 431 and a reset part 432. The flip-flop chain 431 includes first to fourth flip-flops FF1 to FF4. The electrical coupling relationship between the flip-flop chain 431 and the reset part 432 is the same as the electrical coupling relationship in the strobe signal driving section 330 shown in FIG. 4. In FIG. 8, the reset part 432 replaces the inverter 332 shown in FIG. 4. The reset part 432 may reset the first flip-flop FF1 of the flip-flop chain 431 in response to one of the output of the one flip-flop of the flip-flop chain 431 and the reset signal CRCRST. The reset part 432 may reset the first flip-flop FF1 in response to the output DQSIN<2> of the second flip-flop FF2 when the reset signal CRCRST is disabled, and may reset the first flip-flop FF1 when the reset signal CRCRST is enabled. The reset part 432 resets the first flip-flop FF1 regardless of the output DQSIN<2> of the second flip-flop FF2 when the reset signal CRCRST is enabled. Accordingly, it is possible to prevent the data strobe signals DQSIN<1:4> from being generated at the specified time, in response to the reset signal CRCRST which is cyclically generated.

Figure 9:
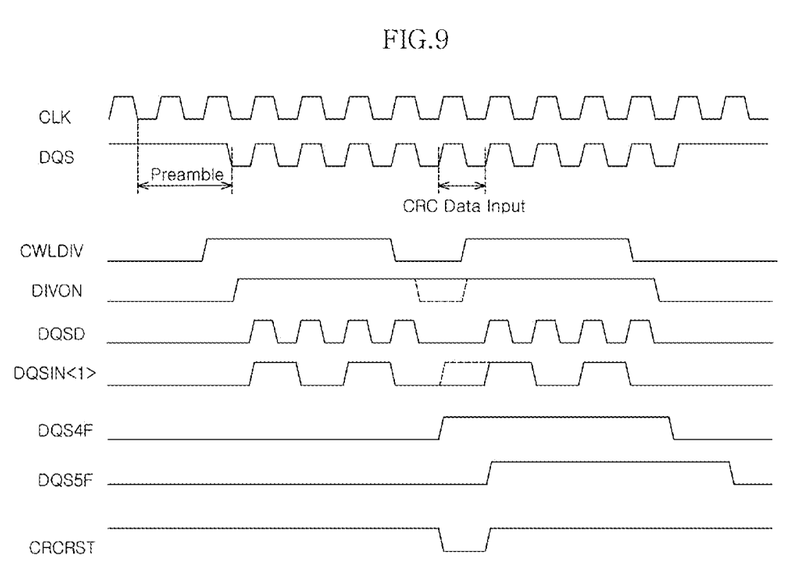
FIG. 9 is a timing diagram showing operations of the strobe signal generation device in accordance with an embodiment of the present invention.

FIG. 9 is a timing diagram showing operations of the strobe signal generation device 4 in accordance with an embodiment of the present invention. Operations of the memory apparatus 2 in accordance with an embodiment of the present invention will be described with reference to FIGS. 1, 2 and 6 to 9. In FIG. 9, it is exemplified that the memory apparatus 2 performs an operation of receiving the CRC data and operates with the burst length of 4. In FIG. 9, in the case where the memory apparatus 2 operates at a high speed, as the frequency of the clock signal CLK increases, the pulse width of the clock signal CLK may be considerably decreased. In this case, when the memory apparatus 2 consecutively receives a first strobe signal DQS with 4 pulses and a second strobe signal DQS with 4 pulses, it may occur that the division enable signal DIVON is not disabled as shown by the dotted line and retains an enabled state. As an interval between the period in which the first strobe signal DQS is received and the period in which the second strobe signal DQS is received is shortened, the probability of the division enable signal DIVON not to be disabled increases. If the division enable signal DIVON is not disabled, as the first data strobe signal DQSIN<1> is generated earlier than a normal case as shown by the dotted line, a misoperation may occur in that the levels of the data strobe signals DQSIN<1:4> subsequently formed are likely to be reversed. In consideration of this fact, the reset signal generating section 440 generates the reset signal CRCRST at a specified time, that is, a time the CRC data is inputted, when the division enable signal DIVON is enabled, and the reset signal CRCRST resets the first flip-flop FF1 of the strobe signal driving section 430 and prevents the first data strobe signal DQSIN<1> from being generated. Accordingly, the memory apparatus 2 may stably and precisely generate the data strobe signals DQSIN<1:4> even though the frequency of the clock signal CLK is increased.

Figure 10:
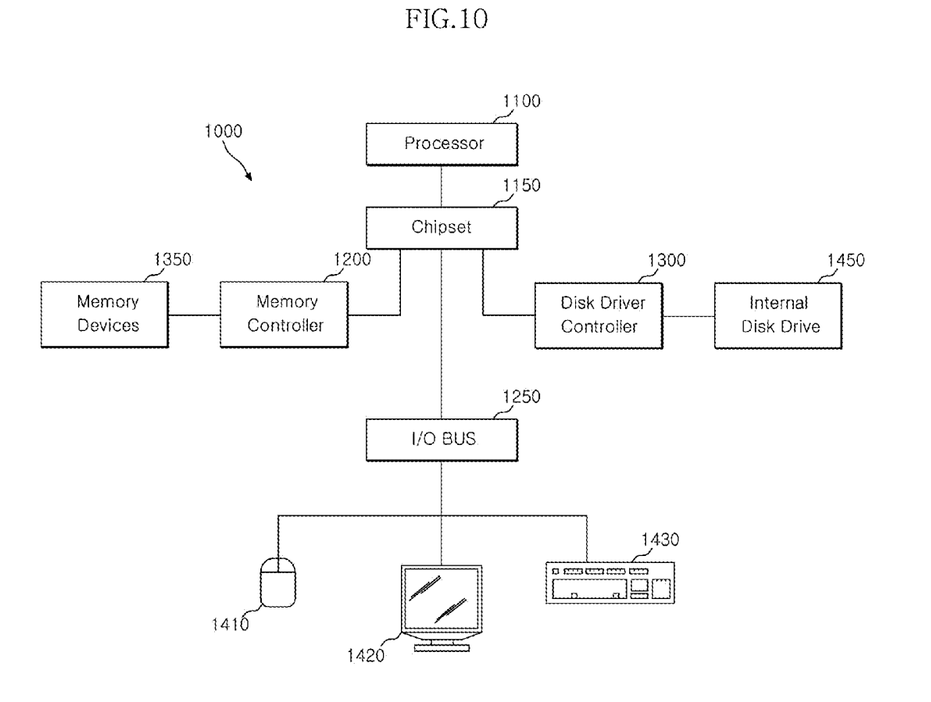
FIG. 10 illustrates a block diagram of a system employing a memory controller circuit in accordance with an embodiment of the present invention.

Referring to FIG. 10, a system 1000 may include one or more processors 1100. The processor 1100 may be used individually or in combination with other processors. A chipset 1150 may be operably coupled to the processor 1100. The chipset 1150 is a communication pathway for signals between the processor and other components of the system 1000, which may include a memory controller 1200, an input/output ("I/O") bus 1250, and a disk drive controller 1300.

Depending on the configuration, any one of a number of different signals may be transmitted through the chipset 1150.

The memory controller 1200 may be coupled to the chipset 1150. The memory controller 1200 can receive a request from the processor 1100 through the chipset 1150. The memory controller 1200 may be operably coupled to one or more memory devices 1350. The memory devices 1350 may correspond to the memory apparatus 120 described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably coupled to the chipset 1150. The disk drive controller 1300 may serve as the communication pathway between the chipset 1150 and one or more internal disk drives 1450. The internal disk drive 1450 may communicate with the disk drive controller 1300 or with the chipset 1150 using virtually any type of communication protocol, including all of those mentioned above with regard to the I/O bus 1250.

While certain embodiments have been described above, it will be understood to those skilled in the art that the embodiments described are by way of example only. Accordingly, the strobe signal generation device and the memory apparatus using the same described herein should not be limited based on the described embodiments. Rather, the strobe signal generation device and the memory apparatus using the same described herein should only be limited in light of the claims that follow when taken in conjunction with the above description and accompanying drawings.

What is claimed is:

1. A strobe signal generation device comprising:
   an enable signal generating section configured to generate a division enable signal in response to a strobe signal;
   a buffering section configured to generate a delayed strobe signal from the strobe signal while the division enable signal is enabled; and
   a strobe signal driving section configured to generate a plurality of data strobe signals with a larger pulse width than the delayed strobe signal, in response to the division enable signal and the delayed strobe signal.

2. The strobe signal generation device according to claim 1, wherein the enable signal generating section enables the division enable signal during a preamble period of the strobe signal when an internal write signal is enabled.

3. The strobe signal generation device according to claim 1, wherein the buffering section provides the strobe signal which is inputted while the division enable signal is enabled, as the delayed strobe signal.

4. The strobe signal generation device according to claim 1, wherein the strobe signal driving section divides the delayed strobe signal and generates the plurality of data strobe signals.

5. The strobe signal generation device according to claim 1, wherein the strobe signal driving section comprises:
   a flip-flop chain including a plurality of flip-flops which are electrically coupled in series, and configured to generate the plurality of data strobe signals in response to the division enable signal and the delayed strobe signal; and
   an inverter configured to reset a first flip-flop of the flip-flop chain in response to an output of one flip-flop of the flip-flop chain.

6. A strobe signal generation device comprising:
   an enable signal generating section configured to generate a division enable signal in response to an internal write signal and a strobe signal;
   a buffering section configured to generate a delayed strobe signal from the strobe signal while the division enable signal is enabled;
   a strobe signal driving section configured to generate a plurality of data strobe signals which have a larger pulse width than the delayed strobe signal, in response to the division enable signal and the delayed strobe signal; and
   a reset signal generating section configured to generate a reset signal in response to the division enable signal.

7. The strobe signal generation device according to claim 6, wherein the enable signal generating section enables the division enable signal in response to a preamble of the strobe signal when the internal write signal is enabled.

8. The strobe signal generation device according to claim 6, wherein the buffering section provides the strobe signal which is inputted while the division enable signal is enabled, as the delayed strobe signal.

9. The strobe signal generation device according to claim 6, wherein the strobe signal driving section divides the delayed strobe signal and generates the plurality of data strobe signals.

10. The strobe signal generation device according to claim 6, wherein the strobe signal driving section comprises:
    a flip-flop chain including a plurality of flip-flops which are electrically coupled in series, and configured to generate the plurality of data strobe signals in response to the division enable signal, the delayed strobe signal and the reset signal; and
    a reset part configured to reset a first flip-flop of the flip-flop chain in response to one of an output of one flip-flop of the flip-flop chain and the reset signal.

11. The strobe signal generation device according to claim 6, wherein the reset signal generating section cyclically generates the reset signal on the basis of a burst length.

12. The strobe signal generation device according to claim 6, wherein the reset signal generating section comprises:
    a flip-flop chain including a plurality of flip-flops which are electrically coupled in series, and configured to generate respective output signals in response to the division enable signal and the delayed strobe signal;
    an inverter configured to invert an output signal of a last flip-flop of the flip-flop chain and reset a first flip-flop; and
    a pulse generation part configured to receive output signals of the last flip-flop and a flip-flop of a stage previous to the last flip-flop, and generate the reset signal.

13. The strobe signal generation device according to claim 12, wherein the reset signal generating section further comprises:
    an input part configured to provide the division enable signal to the flip-flop chain in response to a CRC signal.

14. A memory apparatus comprising:
    a latency unit configured to delay a write signal and generate an internal write signal;
    a strobe signal generation unit configured to generate a plurality of data strobe signals with a larger pulse width than a strobe signal, in response to the strobe signal and the internal write signal, and prevent the data strobe signals from being generated at a specified time, wherein the specified time is determined according to a burst length of the memory apparatus and whether or not the memory apparatus receives Cyclic Redundancy Check (CRC) data; and
    a data input unit configured to latch data in response to the plurality of data strobe signals.

15. The memory apparatus according to claim 14, wherein the strobe signal generation unit generates the plurality of data strobe signals by dividing the strobe signal.

16. The memory apparatus according to claim 14, wherein the strobe signal generation unit comprises:
- an enable signal generating section configured to generate a division enable signal in response to the internal write signal and the strobe signal;
- a buffering section configured to buffer the strobe signal and generate a delayed strobe signal while the division enable signal is enabled;
- a strobe signal driving section configured to generate the plurality of data strobe signals which have a larger pulse width than the delayed strobe signal, in response to the division enable signal, the delayed strobe signal and a reset signal; and
- a reset signal generating section configured to generate the reset signal in response to the division enable signal.

17. The memory apparatus according to claim 16, wherein the strobe signal driving section comprises:
- a flip-flop chain including a plurality of flip-flops which are electrically coupled in series, and configured to generate the plurality of data strobe signals in response to the division enable signal, the delayed strobe signal and the reset signal; and
- a reset part configured to reset a first flip-flop of the flip-flop chain in response to one of an output of one flip-flop of the flip-flop chain and the reset signal.

18. The memory apparatus according to claim 16, wherein the reset signal generating section comprises:
- a flip-flop chain including a plurality of flip-flops which are electrically coupled in series, and configured to generate respective output signals in response to the division enable signal and the delayed strobe signal;
- an inverter configured to invert an output signal of a last flip-flop of the flip-flop chain and reset a first flip-flop; and
- a pulse generation part configured to receive output signals of the last flip-flop and a flip-flop of a stage previous to the last flip-flop, and generate the reset signal.

* * * * *